(12) United States Patent
Kasperkovitz

(10) Patent No.: US 7,432,767 B2
(45) Date of Patent: Oct. 7, 2008

(54) TUNABLE LOW NOISE AMPLIFIER

(75) Inventor: Wolfdietrich Georg Kasperkovitz, Waalre (NL)

(73) Assignee: Semiconductor Ideas to Market (ITOM) B.V., AH Breda (NL)

( * ) Notice: Subject to any disclaimer, the term of this patent is extended or adjusted under 35 U.S.C. 154(b) by 93 days.

(21) Appl. No.: 11/632,601

(22) PCT Filed: Sep. 7, 2005

(86) PCT No.: PCT/EP2005/009625

§ 371 (c)(1),
(2), (4) Date: Jan. 16, 2007

(87) PCT Pub. No.: WO2006/029750

PCT Pub. Date: Mar. 23, 2006

(65) Prior Publication Data

US 2008/0061885 A1    Mar. 13, 2008

(30) Foreign Application Priority Data

Sep. 12, 2004    (EP) .................................. 04077516

(51) Int. Cl.
*H03F 3/191* (2006.01)
*H03F 1/22* (2006.01)
(52) U.S. Cl. .................................... 330/305; 330/311
(58) Field of Classification Search .................... 330/98, 330/133, 305, 311
See application file for complete search history.

(56) References Cited

U.S. PATENT DOCUMENTS

| | | | |
|---|---|---|---|
| 5,068,623 A | 11/1991 | Camin et al. | |
| 5,220,686 A * | 6/1993 | Kasperkovitz et al. | ... 455/234.1 |
| 5,710,523 A | 1/1998 | Kobayashi | |
| 5,914,640 A | 6/1999 | Nasserbakht et al. | |
| 6,121,825 A * | 9/2000 | Ko et al. | ...................... 327/553 |
| 6,232,848 B1 | 5/2001 | Manku | |
| 6,933,787 B1 * | 8/2005 | Kobayashi | ................... 330/311 |

OTHER PUBLICATIONS

Thanachayanont A., et al.; "VHF CMOS integrated active inductor"; Electronics Letters, May 23, 1996, vol. 32, No. 11, pp. 999-1000.

Thanachayanont A., et al; "A 3-V RF CMOS Bandpass Amplifier Using An Active Inductor"; Circuits and Systems, 1998, ISCAS '98;Oriceedubgs if the 1998 IEEE International Symposium, Monterey, CA, USA; IEEE, vol. 1, May 31, 1998, New York, N.Y., USA; pp. 440-443.

* cited by examiner

*Primary Examiner*—Steven J Mottola
(74) *Attorney, Agent, or Firm*—Robert M. McDermott, Esq.

(57) ABSTRACT

Tunable low noise amplifier using an RF current feed back loop (L) coupled between input (IM) and output (OM) means and including first (CAI) and second (CA2) serially coupled first order lowpass RF current amplifiers as well RF current inverter means (INV). To obtain narrow bandpass selectivity within a relatively wide tuning range e.g. from 40 MHz to 1000 MHz said first RF current amplifier is being provided with a current gain larger than that of the second RF current amplifier, and a 3 dB cut off frequency lower than the 3 dB cut off frequency of said second RF current amplifier, a tuning control signal being supplied to both first and second RF current amplifiers to vary the respective 3 dB cut off frequencies thereof.

38 Claims, 5 Drawing Sheets

TUNABLE LOW NOISE AMPLIFIER

The invention relates to a tunable low noise amplifier (LNA). Such tunable low noise amplifier is on itself known, e.g. from U.S. Pat. No. 5,710,523. The known tunable LNA provides wideband lowpass RF selection with maximum flat gain response within its frequency bandwidth. To allow the frequency bandwidth and the linearity characteristics thereof to be tuned, respectively adjusted, after the LNA has been integrated into a monolithic microwave integrated circuit, said known tunable low noise amplifier comprises an adjustable, active feed back circuit providing adjustable regenerative feed back at the 3 dB cut off frequency of its lowpass frequency band. Due to its lowpass filter characteristic, this known tunable LNA is basically not suitable for narrow bandpass selection. Furthermore the use of resistors is inherent to the regenerative feed back applied in this known LNA, which not only gives rise to resistive noise but also require chip area.

A first object of the present invention is to provide an LNA with narrow bandpass selection tunable within a relatively wide tuning range e.g. from 40 MHz to 1000 MHz.

A second object of the invention is to minimize the number of active and passive components, such as resistors, within the feedback loop, therewith minimizing the LNA noise figure as well as chipsize.

A third object of the invention is to maximize power efficiency and to offer flexibility in design allowing to trade off minimum DC current consumption against minimum DC voltage consumption and vice versa.

Now, therefore, a tunable low noise amplifier having input and output means according to the invention is characterized by an RF current feed back loop coupled between said input and output means and including first and second serially coupled first order lowpass RF current amplifiers as well RF current inverter means, said first RF current amplifier having a current gain larger than that of the second RF current amplifier, and a 3 dB cut off frequency lower than the 3 dB cut off frequency of said second RF current amplifier, a tuning control signal being supplied to both first and second RF current amplifiers to vary the respective 3 dB cut off frequencies thereof.

For an application of the invention only a few simple, costeffective and reliable basic building blocks, such as said first order lowpass RF current amplifiers and RF current inverter means, are needed. The combination of gain, frequency dependent gain decrease and phase shift as occurring in said first and second first order lowpass RF current amplifiers applied in a negative feed back loop results in a bandpass selectivity which is variable in both its tuning frequency and filter quality or bandwidth by varying in principle not more than the 3 dB cut off frequency of one or both said first and second RF current amplifiers.

In a preferred embodiment of the tunable LNA according to the invention allowing to further increase the quality or decrease the bandwidth of the LNA bandpass selectivity, said RF current feed back loop also includes a third, first order RF current amplifier coupled to said second, first order RF current amplifier and having a current gain smaller than that of the first, first order RF current amplifier, and a 3 dB cut off frequency substantially higher than that of said first, first order RF current amplifier, a tuning control signal being supplied to said first, second and third, first order RF current amplifier to vary the respective 3 dB cut off frequencies.

To obtain effective suppression of in particular RF loop current frequencies below the bandpass frequency range, the tunable LNA according to the invention is characterized by said input means being coupled to an input of the second RF current amplifier and said output means to an output of said third RF current amplifier.

According to an aspect of the invention said first RF current amplifier comprises a first transistor being arranged in common emitter configuration, whereas said second RF current amplifier comprises a second transistor being arranged in common base configuration, the collector of said first transistor being coupled to the emitter of said second transistor, a tuning control signal varying the DC bias current of both said first and second transistors. Variations in the DC bias current of both first and second transistors cause the input resistance r0 of said transistors to vary in opposite direction and along therewith the 3 dB cut off frequency thereof. This allows for a robust and cost effective implementation using a minimum number of elements within the feed back loop. To further narrow down the bandwidth of the feedback loop, a third transistor arranged in common base configuration is preferably used for said third RF current amplifier, the collector of said second transistor being coupled to the emitter of said third transistor.

To substantially extend the tuning range of the LNA, said first to third transistors are respectively being provided with first to third capacitors, connected between their bases and emitters.

In an embodiment of the invention, said first to third capacitors are being continuously varied with said tuning control signal to enable further fine tuning of the respective 3 dB frequencies of said first to third transistors, In an alternative embodiment of the invention providing bandswitching without affecting the LNA noise figure is characterized by said first to third capacitors being stepwise varied at at least one predetermined value of said tuning control signal.

An embodiment of a tunable low noise amplifier according to the invention with re-use of DC bias currents and allowing to decrease the number of components used as well as chipsize, is characterized by the collector-emitter paths of the first to third transistors being serially DC coupled between a bias voltage and mass.

Preferably, the serially DC coupled first to third transistors are being mass connected through the emitter of the first transistor and coupled to said bias voltage through the collector of said third transistor and a DC shunt device.

An alternative embodiment of a tunable low noise amplifier according to the invention which can be operated at a relatively low bias voltage, is characterized by the collector-emitter paths of said first to third transistors being DC coupled in parallel between a bias voltage and mass.

In such alternative embodiment, the collectors of said first to third transistors are respectively coupled to the bias voltage through a DC shunt device, preventing the RF currents from being shortcircuited to mass.

In an optimum trade-off between stability and selectivity the phase margin of said current feedback loop is positive and smaller than $0.25\pi$.

In an alternative embodiment of the low noise amplifier according to the invention dispensing with said first to third capacitors, is characterized by the first to third transistors being scaled in emitter area to provide a junction capacity substantially larger than the diffusion capacity.

Preferably, the RF coupling of the RF feed back loop to the output means comprises a DC blocking device to stabilize the RF output current of the LNA against tuning signal dependent variations.

Embodiments of the low noise amplifier according to the invention have said input means, respectively said output means, coupled to the loop at one of the inputs or outputs of the first to third RF current amplifiers.

Preferably, a tunable LNA according to the invention with effective high pass selectivity is characterized by said input means, and said output means, being coupled to the loop in common at one of the inputs of the second and third transistors.

These and further aspects and advantages of the invention will be discussed more in detail hereinafter with reference to the disclosure of preferred embodiments, and in particular with reference to the appended Figures in which like reference numerals refer to like elements wherein.

Figure 1:
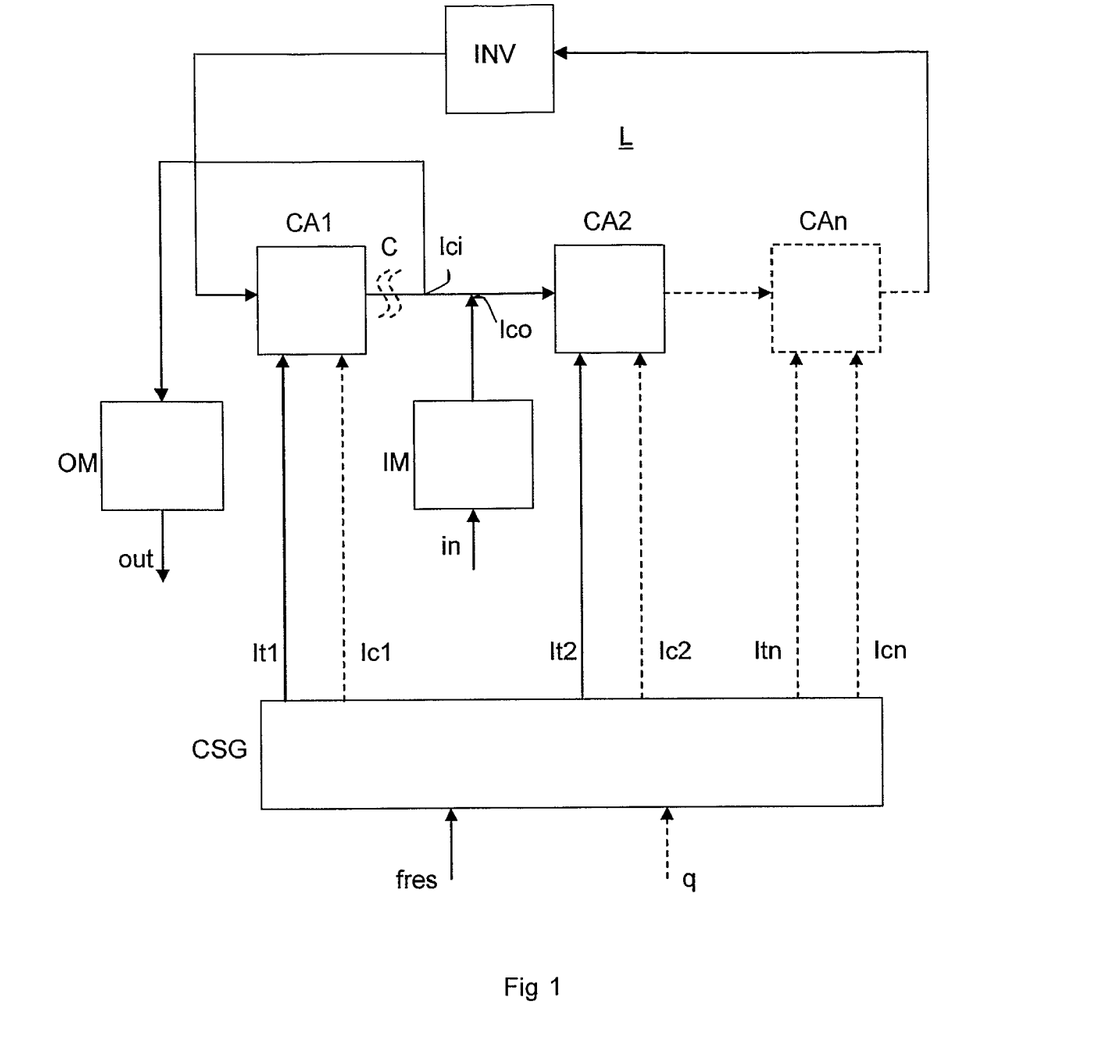
FIG. 1 is a block diagram of a tunable LNA according to the invention, showing the various control options with respect to tuning with or without bandwidth stabilisation.

FIG. 1 shows a general block diagram of a tunable LNA according to the invention having an RF current feed back loop L coupled between input and output means, IM and OM respectively, said an RF current feed back loop L including first to $n^{th}$ serially coupled first order lowpass RF current amplifiers CA1 to CAn and RF current inverter means INV. The current gain of said first RF current amplifier CA1 is larger than that of the second to $n^{th}$ RF current amplifiers CA2-CAn, the current gain of said second to $n^{th}$ RF current amplifiers CA2-CAn being mutually substantially equal. The 3 dB cut off frequency of said first RF current amplifier CA1 is lower than that of the second to $n^{th}$ RF current amplifiers CA2-CAn, the 3 dB cut off frequency of said second to $n^{th}$ RF current amplifiers CA2 to CAn being mutually substantially equal. Tuning control currents It1-Itn are being supplied to each of said first to $n^{th}$ RF current amplifiers CA1-CAn respectively to vary the 3 dB cut off frequencies, as will be explained with respect to FIGS. 2 and 3. Capacity control currents Ic1-Icn alone or in combination with said tuning control currents It1-Itn, may be supplied to each of said first to nth RF current amplifiers CA1-CAn respectively to alternatively vary the 3 dB cut off frequencies, Said tuning and capacity control currents are derived in control signal generator means CSG from tuning and capacity control input signals It and Ic, respectively.

The RF current feed back loop L operates as a tunable bandpass selectivity, in that low RF loop current frequencies are passing through the serially coupled first to $n^{th}$ serially coupled first order lowpass RF current amplifiers CA1 to CAn without noticeably changing in phase. These low RF loop current frequencies are negatively fed back through the RF current inverter means INV CA1 and are strongly suppressed due to the high current gain of in particular the first RF current amplifier CA1. RF loop current frequencies increasing within the lowpass transition region of said first RF current amplifier CA1 will be subjected to a first order phase increase and gain decrease. This causes said negative feedback to more or less gradually decrease. Similar phase increases and gain decreases will be added thereto for RF loop current frequencies increasing within the lowpass transition regions of said second to nth RF current amplifiers CA2-CAn, ultimately turning said negative feedback into positive. The frequency range coinciding with this positive feedback defines the bandpass frequency range of the LNA. At the center frequency of this bandpass frequency range, the overall loop phase shift amounts to 360° giving rise to a regenerative peak in the response characteristic of the RF current feed back loop bandpass selectivity. For RF current frequencies increasing above the center frequency, the phase shift further increases along with a further gradual decrease in the overall gain of said first and second RF current amplifiers, resulting in an increasing suppression of those high RF current frequencies. By an appropriate variation of the 3 dB cut off frequency and phase shift of at least one or preferably more of said first to $n^{th}$ RF current amplifiers CA1-CAn, said bandpass selectivity can be tuned not only in the location of its center frequency, but also in the bandwidth and/or quality (Q) thereof. This can be achieved by using said tuning control currents It1-Itn only, but may alternatively be achieved with said capacity control currents Ic1-Icn. Also combinations of said tuning control currents It1-Itn with said capacity control currents Ic1-Icn may be used to vary the 3 dB cut off frequencies and phase shifts of said first to $n^{th}$ RF current amplifiers CA1-CAn to said effect, as will be explained with reference to FIGS. 2 to 4. The set of tuning control currents It1-Itn and capacity control currents Ic1-Icn are derived in control signal generator CGS from a tuning control signal fres and a bandwidth or quality control signal q. Although the use of tuning control currents It1-Itn would suffice to define the respective 3 dB cut off frequencies and phase shifts of said first to $n^{th}$ RF current amplifiers CA1-CAn providing the desired tuning and bandwidth setting, it may be convenient, dependent on the specific implementation of the RF current amplifiers used, to convey the information of the desired tuning and bandwidth setting in separate tuning and bandwidth control signals It1-Itn and Ic1-Icn, respectively.

In principle, the use of only said first and second RF current amplifiers CA1 and CA2 instead of n RF current amplifiers CA1-CAn, would suffice for an application of the invention. The additional phase and gain effects of the extra RF current amplifiers CA3-CAn, however, allow to further narrow down the bandwidth (or increase the filter quality Q). In a practical embodiment the tunable LNA according to the invention was implemented with three RF current amplifiers CA1-CA3 in the loop, the RF current inverter means INV being included in the first RF current amplifier CA1. The RF current inverter means INV provide a frequency independent signal polarity inversion, which in a balanced structure of RF current amplifiers CA1-CAn may be realized by an adequate cross coupling of a balanced output of one of said RF current amplifiers CA1-CAn to a balanced input of its subsequent RF current amplifier.

An input in of the low noise amplifier according to the invention is coupled through input means IM to a loop current input lci of the RF current feed back loop, whereas a loop current output lco of the RF current feed back loop is coupled through output means OM to an output out the low noise amplifier according to the invention. The input means IM may include a controllable transconductance amplifier for voltage-current conversion and for varying the overall gain of the low noise amplifier according to the invention. The output means OM may include a fixed amplifier providing a stabilized output signal. The loop current input lci and loop current output lco of the RF current feed back loop may be chosen at any arbitrary location of the loop L. In the embodiment shown the loop current input lci and loop current output lco of the RF current feed back loop coincide at the common connection between the output of the first RF current amplifier CA1 and the input of the second RF current amplifier CA2. This results in a bandpass selectivity, as will be illustrated with FIGS. 4C.

Figure 4A:
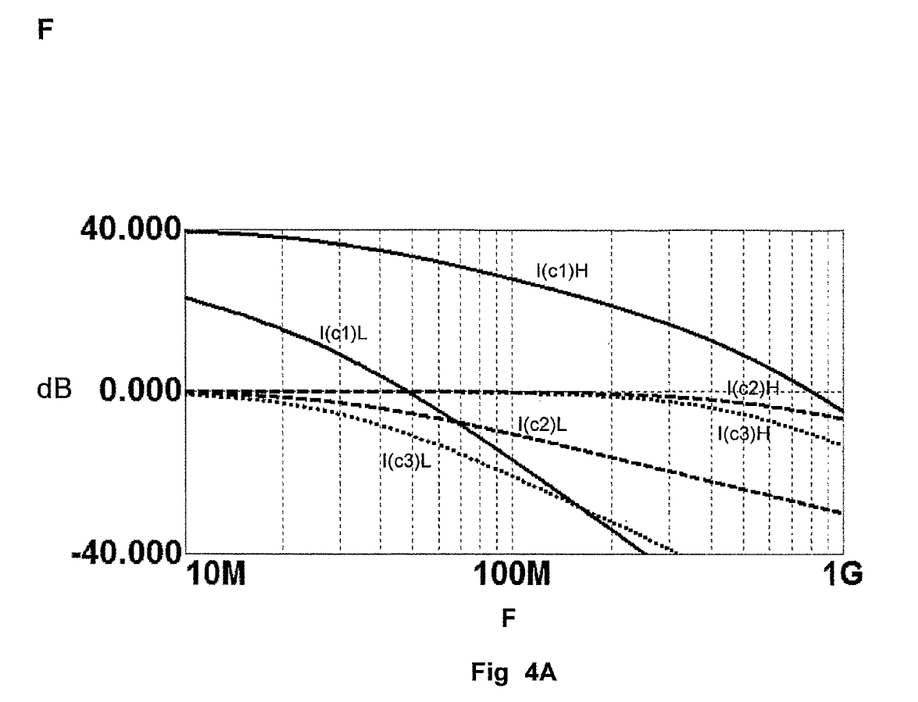
FIG. 4A-4C show various filter characteristics of a tunable LNA according to the invention.
Figure 4B:
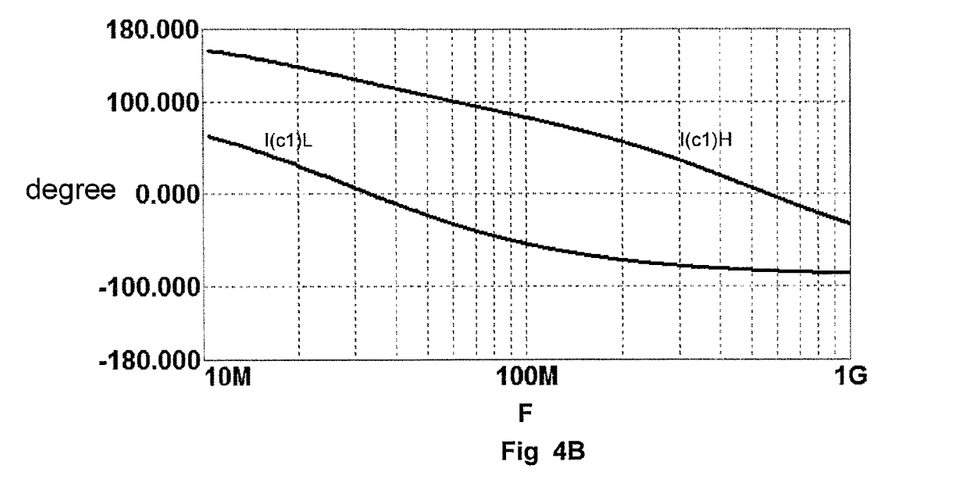
Figure 4C:
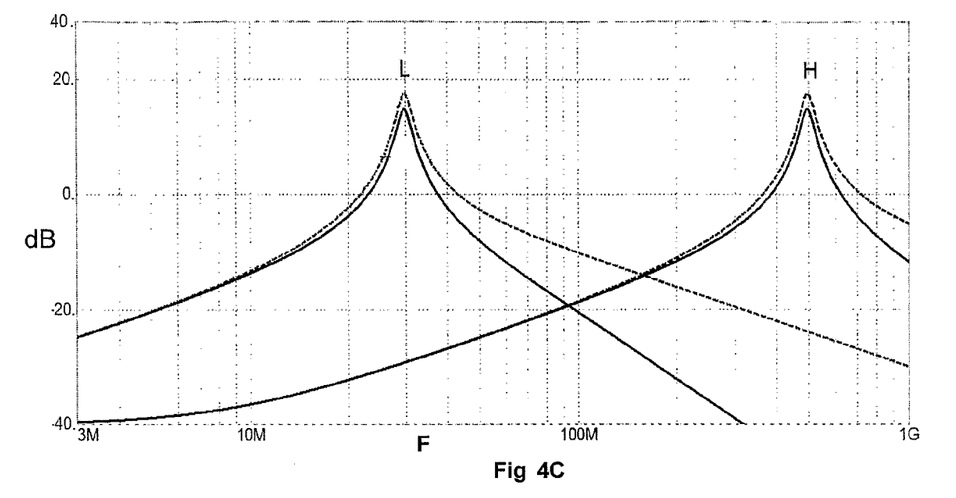

An increase in selectivity is obtained by choosing the loop current input lci and loop current output lco of the RF current feed back loop to coincide at the common connection between the output of the second RF current amplifier CA2 and the input of the third RF current amplifier CA3, etcettera. Other selectivity values may be obtained by choosing the loop current input lci and loop current output lco of the RF current feed back loop to differ in location, e.g. the loop current input lci at the input of the first RF current amplifier CA1 and loop current output lco at the output of the second RF current amplifier CA2. The location of the loop current input lci and loop current output lco in the RF current feed back loop provides an alternative adjustment of the selectivity or bandwidth of the LNA according to the invention, apart from the control through the set of tuning control currents It1-Itn and/or capacity control currents Ic1-Icn. The dotted loop cut C is to indicate the location where the loop is opened for the purpose of open loop measurements upon which the graphs of FIGS. 4A-4C are based.

Figure 2:
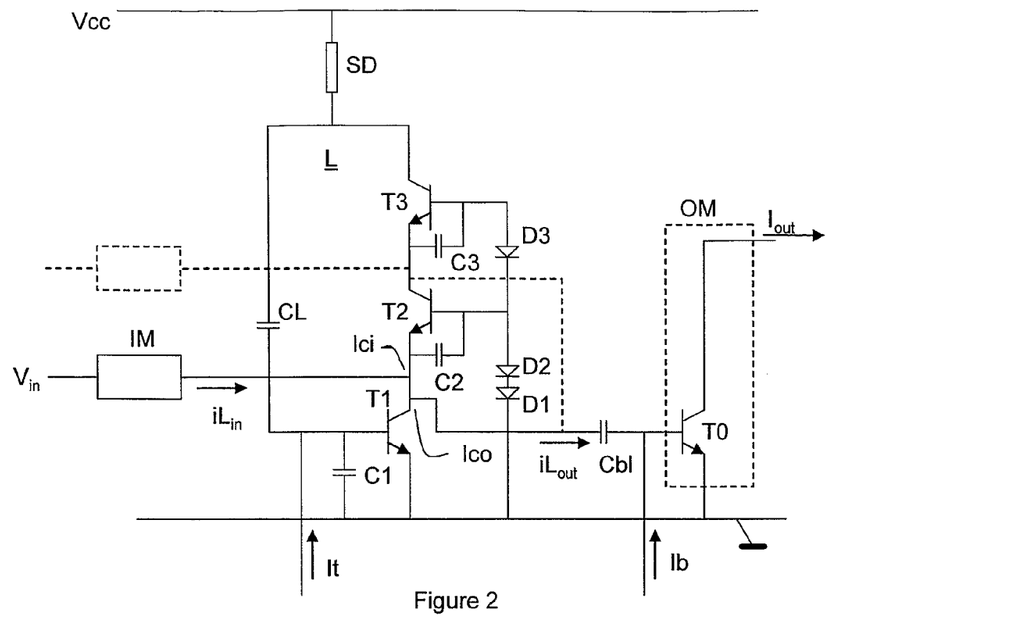
FIG. 2 is a first embodiment of a tunable LNA according to the invention with re-use of DC bias currents.

FIG. 2 shows a first embodiment of a tunable LNA according to the invention, the RF current feed back loop L thereof being coupled between input and output means, IM and OM and including first to third RF current amplifiers respectively comprising first to third transistors T1-T3. The collector-emitter paths of the first to third transistors T1-T3 are serially DC coupled, in that the collector of the first transistor T1 is coupled to the emitter of the second transistor T2 and the collector of said second transistor T2 is coupled to the emitter of said third transistor T3. The emitter of the first transistor T1 is mass connected and the collector of said third transistor T3 is DC coupled through a DC shunt device SD to a bias voltage Vcc and RF fed back through a loop capacitor CL to the base of the first transistor T1. This serial DC coupling of the collector-emitter paths of the first to third transistors T1-T3 provides re-use of DC bias current therewith maximizing power efficiency by minimizing current consumption.

Such DC shunt device SD may be a passive element, such as a resistor having a value sufficiently large to prevent RF loop current leakage to the bias voltage Vcc from occurring and sufficiently small to suffice with a relatively small bias voltage Vcc. Such DC shunt device SD may alternatively be an active circuit, such as a DC current source shunting the DC bias current to a bias reference voltage.

Said first transistor T1 is therewith arranged in common emitter configuration providing a phase inversion from base input to collector output, whereas said second and third transistors T2 and T3 are each being arranged in common base configuration. A tuning control current It is being supplied to the base terminal of T1 varying the DC bias currents of said first to third transistors T1-T3 mutually equally. The serially DC coupled collector-emitter paths of the first to third transistors T1-T3 provide for re-use of DC bias currents, which limits the overall DC current consumption of the LNA.

The input resistance r0 of each of said transistors T1-T3 together with the diffusion (Cdiff) and the base-emitter junction capacity (Cj) defines a first order low pass RC filter characteristic. Due to the first transistor T1 being arranged in common emitter configuration and said second and third transistors T2 and T3 each being arranged in common base configuration, the gain of T1 is approximately the current gain factor B times the gain of each of T2 and T3. Accordingly, also the input resistance r0 of T1 is said current gain factor β times the input resistance r0 of T2 and T3, resulting in the 3 dB cut off frequency of T1 being substantially lower than that of T2 and T3. A robust and cost effective implementation of the invention is therewith obtained, using a minimum number of passive and active components within the feed back loop and being suitable for small chip size integration.

In the embodiment of this FIG. 2, an RF input of the LNA according to the invention is coupled through the above input means IM to loop current input lci of the RF current feed back loop L occurring at the common node between the collector output c1 of the first transistor T1 and the emitter input of the second transistor T2. The loop current output lco of the RF current feed back loop coincides with said loop current input lci and is coupled through a DC current blocking device, such as DC current blocking capacitor Cbl, and the output means OM to an output of the LNA. The bandpass filter characteristic so obtained provides effective suppression of low and high RF loop current frequencies.

In a practical embodiment the input means IM comprises a transconductance amplifier converting an input voltage into a loop input current iLin with a controllable transconductance gm. By varying said transconductance gm the overall gain of the LNA can be adjusted to a wanted value. The output means OM comprises an output transistor To receiving at its base terminal the loop output current iLout from the RF feed back loop at the collector output of the first transistor T1 through said DC current blocking capacitor Cbl. The DC blocking capacitor Cbl is to separate the DC biasing of the loop from that of the output means OM allowing to bias the output means independent from the biasing of the transistors in the loop and to stabilize the RF output current of the LNA against tuning signal dependent variations. A collector of To is coupled to a current output of the LNA providing a filtered RF output current.

Alternatively, the loop current input lci of the RF current feed back loop L may coincide with said loop current output lco at the collector (c2) of the second transistor T2 as indicated with dotted lines. This results in a more selective bandpass transfer characteristic of the LNA according to the invention, than obtained with said loop current input lci and loop current output lco coinciding at the collector (c1) of the first transistor T1, as is illustrated with FIGS. 4A and 4B. A further increase in selectivity is obtained by choosing the loop current input lci and loop current output lco of the RF current feed back loop L to coincide at the collector (c3) of the third transistor T3. Other selectivity values may be obtained by choosing the loop current input lci and loop current output lco of the RF current feed back loop L to differ in location, e.g. the loop current input lci at the input of the first transistor T1 and loop current output lco at the collector (c2) of the second transistor T2. The location of the loop current input lci and loop current output lco in the RF current feed back loop therewith provides an alternative adjustment of the selectivity or bandwidth of the LNA according to the invention, apart from the control through the set of tuning control currents It1-Itn and/or capacity control currents Ic1-Icn.

Increasing DC bias current variations (e.g. due to an increasing tuning control current) cause the input resistance r0 of said first to third transistors T1-T3 to decrease and the diffusion capacity Cdiff thereof to increase and vice versa. According to an aspect of the invention, these counteracting variations are prevented from limiting the tuning range by a large junction capacity Cj, which does not vary with said DC bias current and intrinsically occurs in shunt to said diffusion capacity Cdiff and/or with an extra capacitor coupled in parallel to said diffusion capacity Cdiff. An increase in junction capacity Cj is obtained in on itself known manner by an increase in the emitter width of the transistor in question. As a result the counteracting effect of the diffusion capacity on variations in the 3 dB cut off frequency of the first order low pass first to third transistors or transistor stages T1-T3 will be strongly reduced by the junction capacity and/or the extra capacity. In the embodiment of FIG. 2 such extra capacitors are being used in the form of first to third capacitors C1-C3 being coupled between the base and emitter terminals of said first to third transistors T1-T3, respectively. The capacitances of such extra capacitors may be chosen large with respect to the parasitic capacitances.

It will be clear that if necessary (e.g. to obtain tuning linearity within a wide tuning range of the LNA according to the invention) the use of extra capacitors may well be combined with an appropriate increase in junction capacity.

Variations in the tuning control current It will cause not only the 3 dB cut off frequencies of the first order first to third RF current amplifying transistors T1-T3 and along therewith the LNA tuning frequency to vary, but also the bandwidth thereof. By an adequate variation of the tuning control currents It1 to It3 as a function of the control input signals fres and/or q of the signal control generating means CSG, the tunable LNA can be stabilized in either its bandwidth or in its quality during tuning.

Alternatively, to a certain extent a similar tuning, bandwidth and/or quality control by the bandwidth of the tunable LNA can be obtained by an appropriate variation of first to third capacitors C1-C3, e.g. through the abovementioned capacity control signals Ic1-Ic3, respectively. For this purpose, said first to third capacitors C1-C3 may be implemented with e.g. variable capacity diodes.

According to another aspect of the invention, both tuning control currents It1 to It3 and capacity control signals Ic1-Ic3 may be used to obtain a wanted tuning and bandwidth or quality performance of the LNA. For instance, said first to third capacity control currents Itc1-Itc3 may be used to vary said first to third capacitors C1-C3 continuously to enable further fine tuning of the respective 3 dB frequencies of said first to third transistors, or alternatively, stepwise to obtain band switching at at least one predetermined value of said tuning control signal It without noticeably affecting the LNA noise figure.

In an optimum trade-off between stability and selectivity the phase margin of said current feedback loop is positive and smaller than $0.25\pi$.

Figure 3:
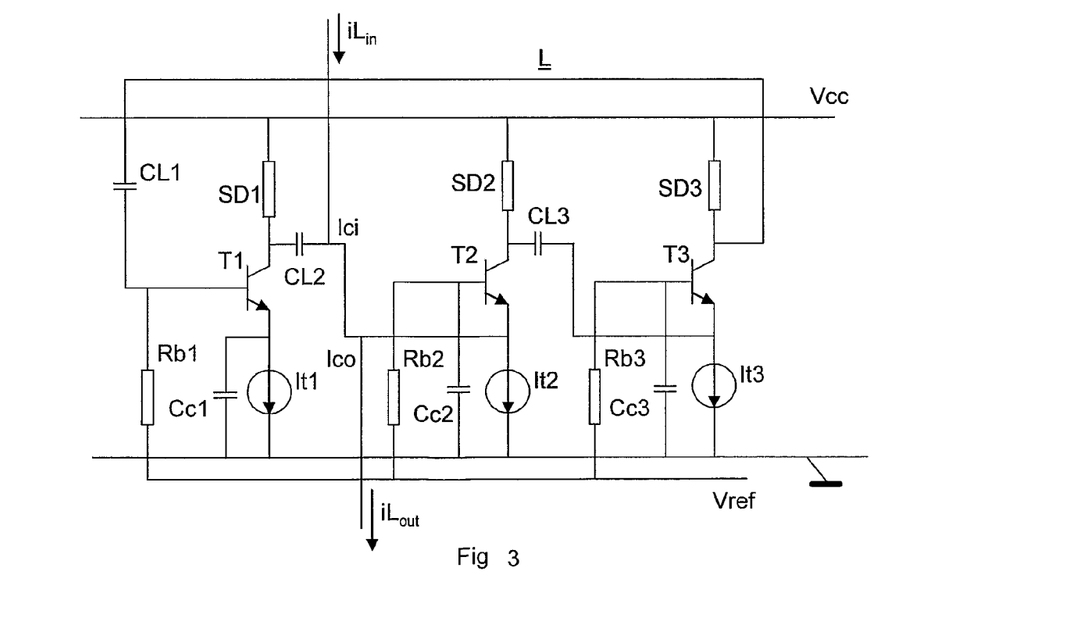
FIG. 3 is a second embodiment of a tunable LNA according to the invention with minimum bias voltage requirements.

FIG. 3 shows a second embodiment of an RF feed back loop L for use in a tunable LNA according to the invention with minimum bias voltage requirements. In the embodiment shown, the first to third transistors T1-T3 are being dimensioned in its emitter width such that extra capacitors shunting the base-emitter junction capacity can be dispensed with while effectively preventing the counteractive diffusion capacity from limiting the tuning range.

Said RF current feed back loop L receives an RF loop input current iLin from input means IM (not shown) at the common node between the collector of the first transistor T1 and the emitter of the second transistor T2 and supplies an RF loop output current iLout to output means OM (not shown) from the same common node between the collector of the first transistor T1 and the emitter of the second transistor T2. The loop current input lci and output lco of the RF current feed back loop L therewith coincide with those shown in the LNA of FIG. 2.

The RF current feed back loop L includes first to third RF current amplifiers respectively comprising first to third transistors T1-T3. The collector-emitter paths of the first to third transistors T1-T3 are serially RF coupled in the loop, in that the collector of the first transistor T1 is coupled to the emitter of the second transistor T2 through a second RF coupling capacitor CL2, the collector of said second transistor T2 to the emitter of said third transistor T3 through a third RF coupling capacitor CL3 and the collector of said third transistor T3 is fed back to the base of said first transistor T1 through a first RF coupling capacitor CL1. The collectors of each transistor T1 to T3 are coupled through respective DC shunt devices SD1 to SD3, respectively to said DC bias voltage. The emitter of the first transistor T1 is RF mass connected through an RF coupling capacitor Cc1 and is coupled to an emitter current source It1. The bases of the second and third transistors T2 and T3 are RF mass connected through RF coupling capacitor Cc2 and Cc3, respectively, and the emitters thereof are coupled to emitter current sources It2 and It3, This results in said first transistor T1 being arranged in common emitter configuration providing phase inversion from its base input to its collector output, and said second and third transistors T2 and T3 each being arranged in common base configuration. The collector-emitter paths of said first to third transistors T1-T3 are therewith DC coupled in parallel between a bias voltage Vcc and mass allowing to maximize power efficiency at minimum DC bias voltage requirements.

Bases of first to third transistors T1-T3 are being coupled through first to third bias resistors Rb1-Rb3 respectively to a voltage reference Vref for a proper bias setting.

The emitter current sources It1-It3 provide said first to third tuning control currents It1-It3 to said first to third transistors T1-T3, respectively. These tuning control currents It1-It3 are mutually independent and are supplied to said bases of first to third transistors T1-T3 allowing for an extra degree of freedom in controlling the tuning of the 3 dB cut off frequencies in the first order low pass characteristic of each first to third transistor T1-T3 with respect to the embodiment of FIG. 2. This feature offers more flexibility to stabilize the bandwidth of the tunable LNA during tuning by appropriately varying said tuning control currents It1-It3.

Also here, the loop current input lci of the RF current feed back loop L may be chosen at a location in the loop, differing from that of said loop current output lco for reasons already mentioned with respect to FIGS. 1 and 2.

FIG. 4A shows the amplitude (in dB) to frequency filter characteristic of the first to third transistors T1-T3 in a frequency range from 10 MHz to 1 GHz of a behavior model of the tunable LNA of FIG. 2 in an open loop configuration of RF current feed back loop L, with loop opening at cut C of FIG. 1, corresponding to a loop opening at the collector output C1 of the first transistor T1 of FIG. 2, at low and high tuning positions IL and IH (i.e. low and high tuning control currents Itl and Ith), respectively, said characteristics being measured at the collectors C1-C3 of first to third transistors T1-T3 and represented with respectively solid curves I(C1)L and I(C1)H; dashed curves I(C2)L and I(C2)H and dotted curves I(C3)L and I(C3)H. These curves show the occurrence of the open loop 3 dB cut off frequencies of these characteristics at approximately 30 MHz and 500 MHz for said low and high tuning positions IL and IH, respectively FIG. 4B shows the phase (in angular degrees) to frequency filter characteristic of the first to third transistors T1-T3 in a frequency range from 10 MHz to 1 GHz of a behavior model of the tunable LNA of FIG. 2 in an open loop configuration of RF current feed back loop L, with loop opening at cut C of FIG. 1, corresponding to a loop opening at the collector output C1 of the first transistor T1 of FIG. 2, at low and high tuning positions IL and IH. The curves show the occurrence of positive regenerative feed back at approximately 30 MHz and 500 MHz for the low and high tuning positions IL and IH, respectively.

FIG. 4C shows in dotted curves I(C2)L and I(C2)H the overall amplitude (in dB) to frequency filter characteristic of the overall tunable LNA according to the invention with the input and output means IM and OM coinciding at the collector of the second transistor T2 in FIG. 2 for the low and high tuning positions IL and IH, respectively. Solid curves I(C3)L and I(C3)H represent the overall amplitude (in dB) to frequency filter characteristic of the overall tunable LNA according to the invention with the input and output means IM and OM coinciding at the collector of the second transistor T3 in FIG. 2 for the low and high tuning positions IL and IH, respectively. These graphs show how on the one hand the LNA bandpass center frequency varies dependent on the 3 dB cut off frequencies of the open loop characteristics of FIG. 4A, i.e. the frequencies of occurrence of positive regenerative feed back in the RF current feed back loop L, which in turn are defined by the tuning control currents at said low and high tuning positions IL and IH. The LNA bandpass selectivity on the other hand varies dependent on the location of loop current input and output with respect to the first to third transistors T1-T3 in the loop.

Now, the present invention has been disclosed hereabove with reference to preferred embodiments thereof. Persons skilled in the art will recognize that numerous modifications and changes may be made thereto without exceeding the scope of the appended Claims. For example, the input and output means IM and OM may well be coupled to the RF feed back loop L at locations other than shown in FIGS. 2 and 3, dependent on the filter characteristic wanted, the first to $n^{th}$ serially coupled first order lowpass RF current amplifiers CA1 to CAn may well be implemented using balanced circuit arrangements instead of the unbalanced configured first to third transistors used in the embodiments of FIGS. 3 and 4, in which event RF current inverter means INV may easily be implemented by an adequate cross coupling of a balanced output of a certain RF current amplifier in the loop to a balanced input of a subsequent RF current amplifier.

Also field effect transistors may be used instead of bipolar transistors, in which case the terms base, collector and emitter as used throughout the description and claims are to be understood mutatis mutandis as gate, drain and source. In consequence, the embodiments should be considered as being illustrative, and no restriction should be construed from those embodiments, other than as have been recited in the Claims.

The invention claimed is:

1. A tunable low noise amplifier comprising:
   input and output circuits, and
   an RF current feed back loop, coupled between the input and output circuits, that includes:
      first and second serially coupled first order lowpass RF current amplifiers, and
      an RF current inverter,
   wherein:
   the first RF current amplifier has a current gain that is larger than a current gain of the second RF current amplifier,
   the first RF current amplifier has a 3 dB cut off frequency that is lower than a 3 dB cut off frequency of the second RF current amplifier, and
   the first and second RF current amplifiers are configured to receive first and second tuning control signals, respectively, that control the 3 dB cut off frequencies.

2. The low noise amplifier of claim 1, wherein:
   the RF current feed back loop includes a third, first order lowpass RF current amplifier, coupled to the second RF current amplifier, that has a current gain smaller than that of the first RF current amplifier, and a 3 dB cut off frequency substantially higher than that of the first RF current amplifier, and
   the third RF current amplifier is configured to receive a third tuning control signal that controls the 3 dB cut off frequency.

3. The low noise amplifier of claim 2, wherein:
   the first RF current amplifier includes a first transistor in a common emitter configuration,
   the second RF current amplifier includes a second transistor in a common base configuration,
   a collector of the first transistor is coupled to an emitter of the second transistor, and
   the first and second tuning control signals are configured to vary a DC bias current of the first and second transistors.

4. The low noise amplifier of claim 3, wherein:
   the third RF current amplifier includes a third transistor in a common base configuration, and
   a collector of the second transistor is coupled to an emitter of the third transistor.

5. The low noise amplifier of claim 4, wherein the third tuning control signal is configured to vary a DC bias setting of the third transistor.

6. The low noise amplifier of claim 4, wherein the first to third transistors include, respectively, first to third capacitors connected between their bases and emitters.

7. The low noise amplifier of claim 6, wherein the first to third capacitors are configured to be varied by the tuning control signal.

8. The low noise amplifier of claim 6, wherein the first to third capacitors are configured to be stepwise varied by at least one predetermined value of the tuning control signal.

9. The low noise amplifier of claim 3, wherein collector-emitter paths of the first and second transistors are serially DC coupled between a bias voltage and a reference voltage.

10. The low noise amplifier of claim 9, wherein the serially DC coupled first and second transistors are connected through an emitter of the first transistor and coupled to the bias voltage through a collector of the second transistor and a DC shunt device.

11. The low noise amplifier of claim 10, wherein a DC bias current of both first and second transistors is varied by the tuning control signal by a variation of a bias setting of an input transistor.

12. The low noise amplifier of claim 3, wherein collector-emitter paths of the first and second transistors are DC coupled in parallel between a bias voltage and a reference voltage.

13. The low noise amplifier of claim 12, wherein collectors of the first and second transistors are respectively coupled to the bias voltage through a DC shunt device.

14. The low noise amplifier of claim 2, wherein the input and output circuits are coupled to the loop at an input or output of one of the first to third RF current amplifiers.

15. The low noise amplifier of claim 4, wherein the input and output circuits are coupled to the loop at an input or output of one of the first to third RF current amplifiers.

16. The low noise amplifier of claim 1, wherein the RF current feedback loop provides a positive loop phase margin smaller than $0.25\pi$.

17. The low noise amplifier of claim 4, wherein the first to third transistors are scaled in emitter area to provide a junction capacity substantially larger than a diffusion capacity.

18. The low noise amplifier of claim 4, wherein an RF coupling of the RF feed back loop to the output circuit includes a DC blocking device.

19. The low noise amplifier of claim 15, wherein the input and output circuits are coupled to the loop in common at an input of one of the second and third transistors.

20. The low noise amplifier of claim 1, wherein:
   the first RF current amplifier includes a first transistor in a common emitter configuration,
   the second RF current amplifier includes a second transistor in a common base configuration,
   a collector of the first transistor is coupled to an emitter of the second transistor, and the first and second tuning control signals are configured to vary a DC bias current of the first and second transistors.

21. The low noise amplifier of claim 4, wherein collector-emitter paths of the first and second transistors are serially DC coupled between a bias voltage and a reference voltage.

22. The low noise amplifier of claim 21, wherein a DC bias current of both first and second transistors is varied by the tuning control signal by a variation of a bias setting of an input transistor.

23. The low noise amplifier of claim 4, wherein collector-emitter paths of the first and second transistors are DC coupled in parallel between a bias voltage and a reference voltage.

24. The low noise amplifier of claim 23, wherein collectors of the first and second transistors are respectively coupled to the bias voltage through a DC shunt device.

25. The low noise amplifier of claim 7, wherein collector-emitter paths of the first and second transistors are serially DC coupled between a bias voltage and a reference voltage.

26. The low noise amplifier of claim 25, wherein a DC bias current of both first and second transistors is varied by the tuning control signal by a variation of a bias setting of an input transistor.

27. The low noise amplifier of claim 7, wherein collector-emitter paths of the first and second transistors are DC coupled in parallel between a bias voltage and a reference voltage.

28. The low noise amplifier of claim 27, wherein collectors of the first and second transistors are respectively coupled to the bias voltage through a DC shunt device.

29. The low noise amplifier of claim 4, wherein the input and output circuits are coupled to the loop in common at an input or output of one of the first to third RF current amplifiers.

30. The low noise amplifier of claim 29, wherein the RF current feedback loop provides a positive loop phase margin smaller than $0.25\pi$.

31. The low noise amplifier of claim 30, wherein an RF coupling of the RF feed back loop to the output circuit includes a DC blocking device.

32. The low noise amplifier of claim 6, wherein the input and output circuits are coupled to the loop in common at an input or output of one of the first to third RF current amplifiers.

33. The low noise amplifier of claim 32, wherein the RF current feedback loop provides a positive loop phase margin smaller than $0.25\pi$.

34. The low noise amplifier of claim 33, wherein an RF coupling of the RF feed back loop to the output circuit includes a DC blocking device.

35. The low noise amplifier of claim 4, wherein the RF current feedback loop provides a positive loop phase margin smaller than $0.25\pi$.

36. The low noise amplifier of claim 6, wherein the RF current feedback loop provides a positive loop phase margin smaller than $0.25\pi$.

37. The low noise amplifier of claim 6, wherein the first to third transistors are scaled in emitter area to provide a junction capacity substantially larger than a diffusion capacity.

38. The low noise amplifier of claim 6, wherein an RF coupling of the RF feed back loop to the output circuit includes a DC blocking device.

\* \* \* \* \*